United States Patent
Peng et al.

(10) Patent No.: US 9,954,171 B2
(45) Date of Patent: Apr. 24, 2018

(54) ELECTRONIC DEVICE AND MANUFACTURING METHOD THEREOF

(71) Applicant: Wistron Corporation, New Taipei (TW)

(72) Inventors: Yu-Jung Peng, New Taipei (TW); Hsin-Yu Hsieh, New Taipei (TW); Yi-Kai Wang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/484,295

(22) Filed: Sep. 12, 2014

(65) Prior Publication Data

US 2015/0287924 A1 Oct. 8, 2015

(30) Foreign Application Priority Data

Apr. 7, 2014 (TW) .............................. 103112718 A

(51) Int. Cl.
*H01L 51/00* (2006.01)
*H01L 51/05* (2006.01)
*H01L 27/28* (2006.01)

(52) U.S. Cl.
CPC ...... *H01L 51/0018* (2013.01); *H01L 51/0023* (2013.01); *H01L 51/0541* (2013.01); *H01L 51/0554* (2013.01); *H01L 27/283* (2013.01)

(58) Field of Classification Search
None
See application file for complete search history.

(56) References Cited

U.S. PATENT DOCUMENTS 8,670,081 B2    3/2014  Yang
2007/0120116 A1*  5/2007  Han .................. H01L 51/107
                                                        257/40

(Continued)

FOREIGN PATENT DOCUMENTS

CN    100538487    9/2009
TW    201203557    1/2012

OTHER PUBLICATIONS

"Office Action of Taiwan Counterpart Application with partial English translation", dated Feb. 17, 2016, p. 1-p. 6, in which the listed reference was cited.

(Continued)

*Primary Examiner* — Mounir Amer
(74) *Attorney, Agent, or Firm* — JCIPRNET

(57) ABSTRACT

A manufacturing method of an electronic device includes: providing a substrate; forming a source and a drain on the substrate; forming a semiconductor layer on the substrate; forming a first light sensitive material layer on the semiconductor layer; removing a first portion of the first light sensitive material layer by a first exposure and development process and maintaining a second portion of the first light sensitive material layer to serve as a first gate insulation layer; patterning the semiconductor layer to form a channel layer below the first gate insulation layer; forming a second light sensitive material layer on the substrate; removing a third portion of the second light sensitive material layer by a second exposure and development process to expose at least a part of the first gate insulation layer; and forming a first gate on the first gate insulation layer. An electronic device is also provided.

11 Claims, 9 Drawing Sheets

(56) References Cited

U.S. PATENT DOCUMENTS

| | | | |
|---|---|---|---|
| 2008/0044986 A1* | 2/2008 | Storbeck | H01L 21/28185 438/471 |
| 2008/0087886 A1* | 4/2008 | Yang | G02F 1/1362 257/40 |
| 2008/0121875 A1* | 5/2008 | Kim | H01L 51/052 257/40 |
| 2012/0264906 A1* | 10/2012 | Marks | B82Y 10/00 528/86 |
| 2012/0319102 A1* | 12/2012 | Yamazaki | H01L 29/7869 257/43 |
| 2013/0075734 A1 | 3/2013 | Cain et al. | |
| 2013/0092943 A1* | 4/2013 | Hatano | H01L 29/42384 257/57 |
| 2013/0126860 A1 | 5/2013 | Fukuda et al. | |
| 2013/0153890 A1* | 6/2013 | Yoneda | H01L 27/1225 257/43 |
| 2013/0228756 A1* | 9/2013 | Lee | H01L 51/52 257/40 |
| 2013/0288426 A1* | 10/2013 | Akimoto | H01L 29/66765 438/104 |
| 2014/0070422 A1* | 3/2014 | Hsiao | H01L 24/24 257/774 |
| 2017/0229585 A1* | 8/2017 | Yamazaki | H01L 29/78693 |

OTHER PUBLICATIONS

"Office Action of China Counterpart Application," dated Jun. 5, 2017, with English translation thereof, p. 1-p. 14, in which the listed references were cited.

* cited by examiner

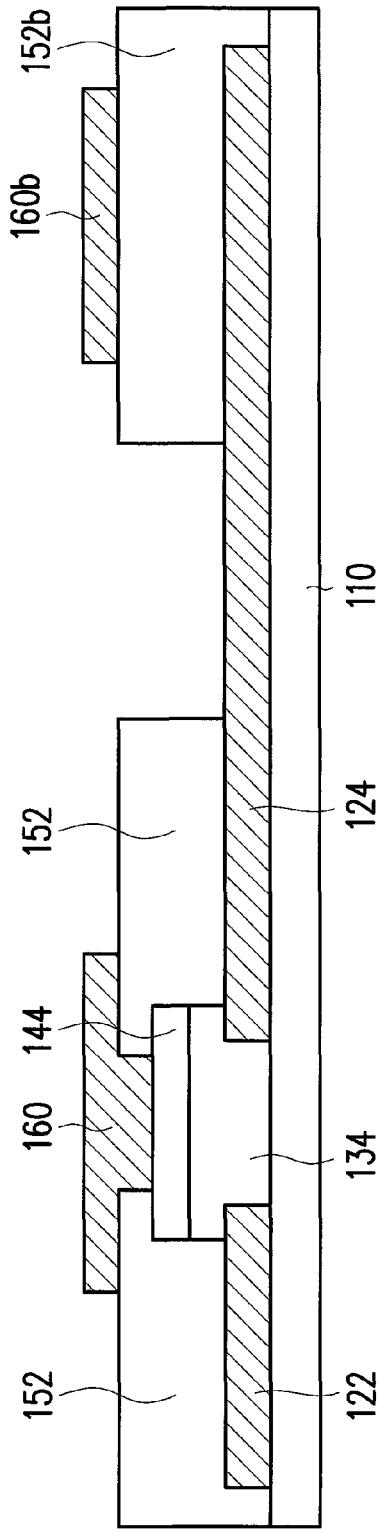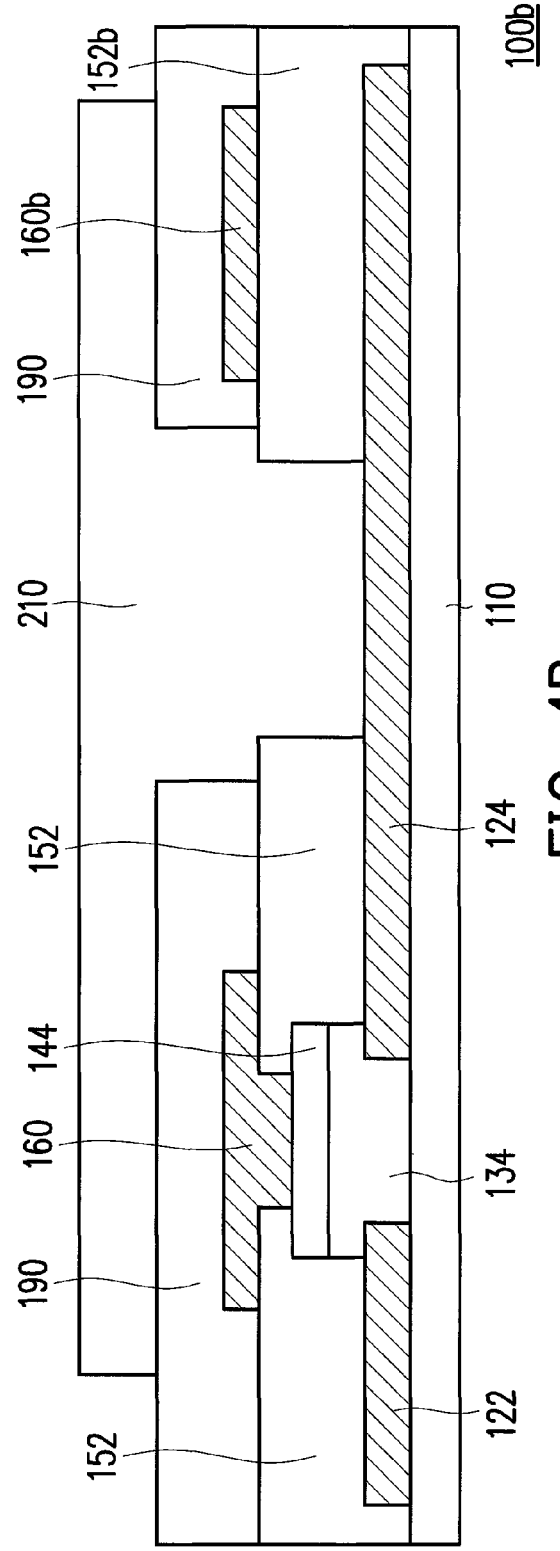

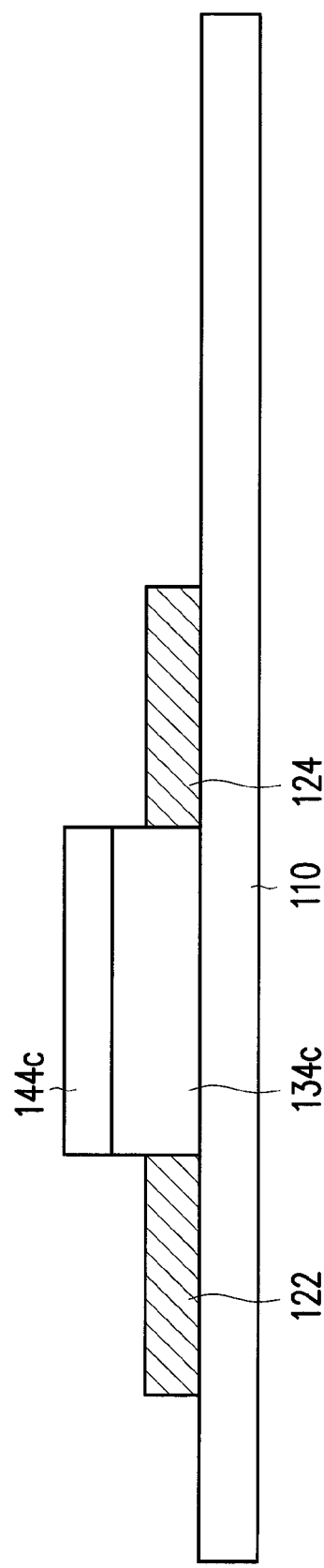
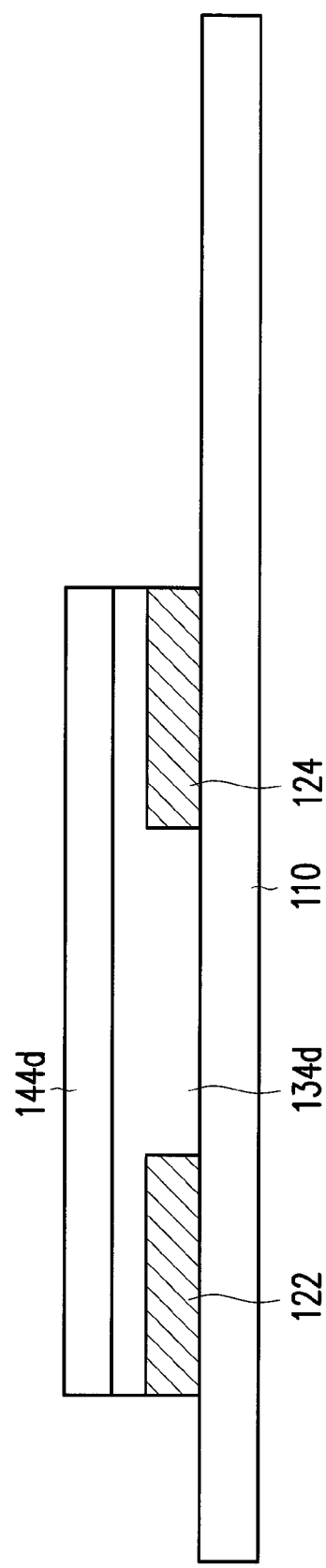
FIG. 5A
FIG. 5B

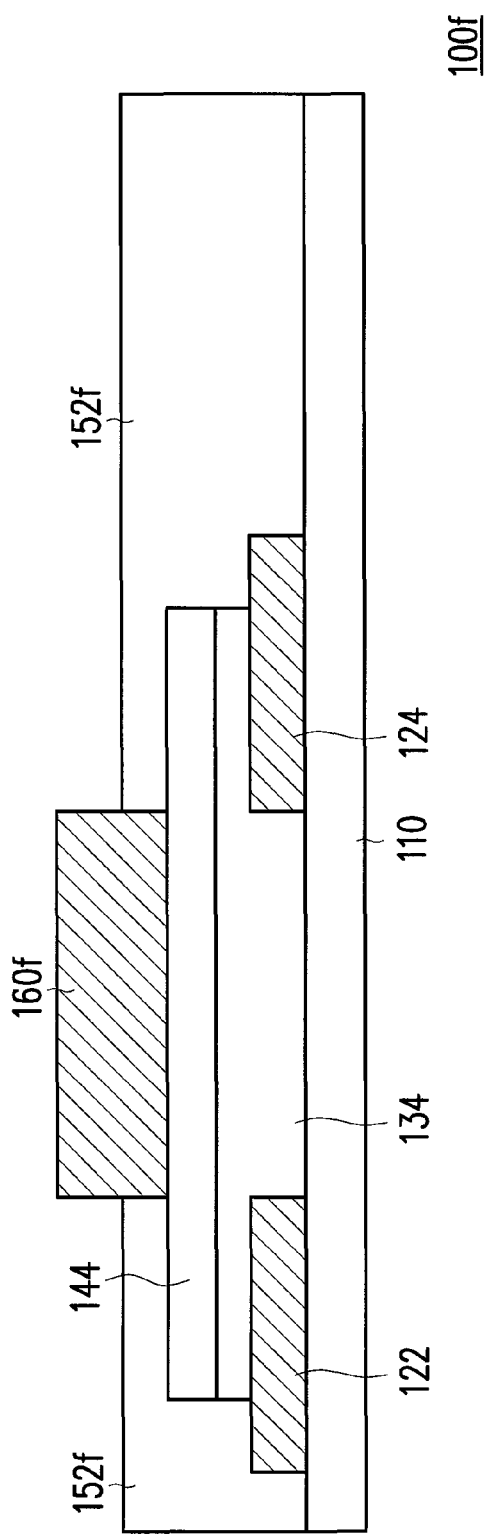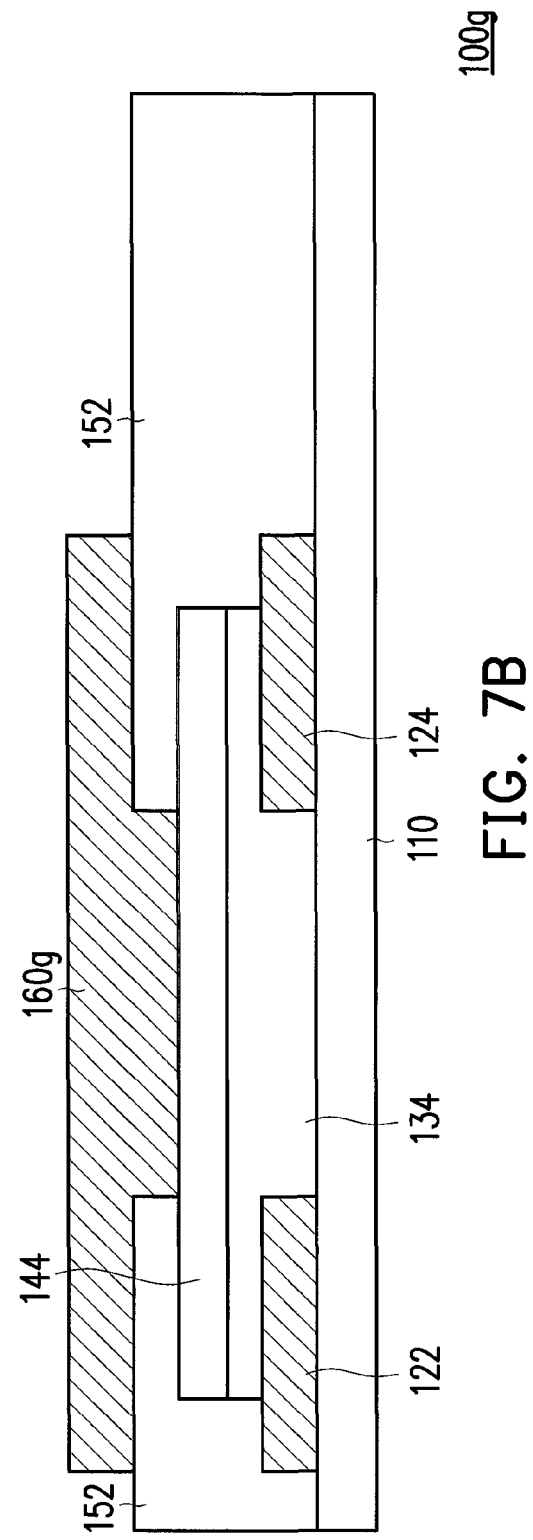

ELECTRONIC DEVICE AND MANUFACTURING METHOD THEREOF

CROSS-REFERENCE TO RELATED APPLICATION

This application claims the priority benefit of Taiwan application serial no. 103112718, filed on Apr. 7, 2014. The entirety of the above-mentioned patent application is hereby incorporated by reference herein and made a part of this specification.

BACKGROUND OF THE DISCLOSURE

1. Field of the Disclosure

The disclosure relates to an electronic device and a manufacturing method thereof.

2. Description of Related Art

With the improvement of the semiconductor manufacturing process, various electronic devices, such as transistors, capacitors, resistors, display pixels, image-sensing pixels, etc., are able to be miniaturized. In the display or image-sensing technology, the quality of transistors in pixel arrays is a crucial factor determining the display quality and the image quality rendered. Differing from the manufacturing process of chips, which manufactures a portion of a transistor by performing ion implantation on a silicon substrate in a top-down manner, in the technology of display panels, a transistor is manufactured by stacking thin films of different characteristics on a substrate. Therefore, this kind of transistors is also referred to as thin film transistors.

A conventional thin film transistor includes a source, a drain, a channel layer, a gate insulation layer, and a gate. The source and the drain may be formed by using a first photolithography process, the channel layer may be formed by using a second photolithography process, the gate insulation layer may be formed by using a third photolithography process, and the gate is formed by using a fourth photolithography process. Therefore, it requires at least four photolithography processes to manufacture a thin film transistor, and thus require four photomasks. In addition, each of the photolithography processes includes the five steps of disposing the photoresist, exposing, developing, etching, and removing the photoresist, etc. In other words, it requires at least twenty manufacturing steps to manufacture a thin film transistor. The numerous manufacturing steps make it difficult to reduce the total time and cost of manufacture.

SUMMARY OF THE DISCLOSURE

The disclosure provides a manufacturing method of an electronic device capable of reducing manufacturing steps to reduce a total time and cost of manufacture.

The disclosure provides an electronic device having lower cost and less time of manufacture.

A manufacturing method of an electronic device according to an embodiment of the disclosure includes: providing a substrate; forming a source and a drain on the substrate; forming a semiconductor layer on the substrate and causing the semiconductor layer to cover the source and the drain; forming a first light sensitive material layer on the semiconductor layer; removing a first portion of the first light sensitive material layer by using a first exposure and development process and maintaining a second portion of the first light sensitive material layer as a first gate insulation layer; patterning the semiconductor layer to form a channel layer below the first gate insulation layer; forming a second light sensitive material layer and causing the second light sensitive material layer to cover the source, the drain, the channel layer, and the first gate insulation layer; removing a third portion of the second light sensitive material layer by using a second exposure and development process to expose at least one portion of the first gate insulation layer; and forming a first gate on the first gate insulation layer.

An electronic device according to an embodiment of the disclosure includes a substrate, a source, a drain, a channel layer, a first gate insulation layer, a dielectric layer, and a first gate. The source is disposed on the substrate, the drain is disposed on the substrate, and the channel layer connects the source and the drain. The first gate insulation layer is disposed on the channel layer, and the dielectric layer covers a portion of the substrate and exposes at least a portion of the first gate insulation layer. In addition, the first gate insulation layer and the dielectric layer are formed of a light sensitive material. The first gate is disposed on the first gate insulation layer.

In the electronic device and the manufacturing method thereof according to the embodiment of the disclosure, since the light sensitive material is used to manufacture the gate insulation layer and another layer (i.e. the dielectric layer) on the first gate insulation layer, the two layers may be completed by using the exposure and development process without using etching and photoresist-removing process. In addition, the layers are kept in the electronic device without being removed after the manufacturing process. In this way, the steps of manufacturing the electronic device may be reduced, so as to reduce the time and cost of manufacture.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIGS. 4A and 4B are cross-sectional schematic views illustrating two steps of a manufacturing method of an electronic device according to the third embodiment of the disclosure.

FIGS. 5A and 5B respectively illustrate a minimally extended range and a maximally extended range of a first gate insulation layer in the step shown in FIG. 1F.

FIGS. 7A and 7B respectively illustrate a minimally extended range and a maximally extended range of a first gate in the step shown in FIG. 1I.

DESCRIPTION OF THE EMBODIMENTS

Figure 1A:
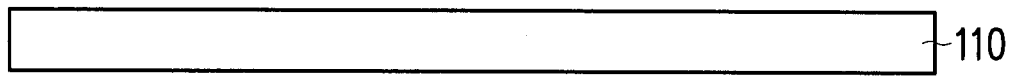
FIGS. 1A to 1I are cross-sectional schematic views illustrating steps of a manufacturing method of an electronic device according to the first embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIGS. 1A to 1I are cross-sectional schematic views illustrating steps of a manufacturing method of an electronic device according to the first embodiment of the disclosure. Referring to FIGS. 1A to 1I, the manufacturing method of the electronic device according to the first embodiment includes the following steps. First of all, as shown in FIG. 1A, a substrate 110 is provided. In addition, the substrate 110 may be a plastic substrate (a thickness thereof is from 10 micrometers to 300 micrometers, for example), a glass substrate (a thickness thereof is from 50 micrometers to 760 micrometers, for example), or a metal foil (a thickness thereof may be 10 micrometers to 300 micrometers). A material of the plastic substrate may be polyethylene naphthalate (PEN), polyethylene terephthalate (PET), or polyimide, for example.

Figure 1B:
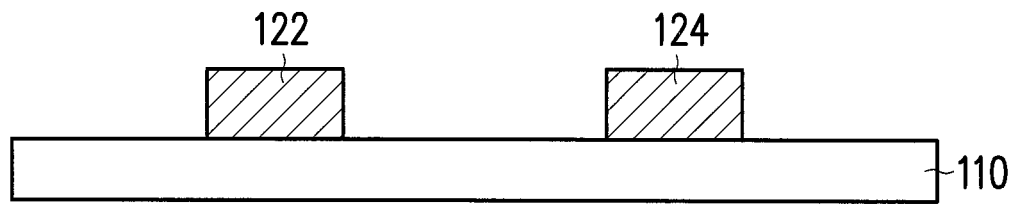

Then, as shown in FIG. 1B, a source 122 and a drain 124 are formed on the substrate 110. In this embodiment, the source 122 and the drain 124 may be formed by using a conventional photolithographic etching process. For example, a conductive layer may be formed on the substrate 110. Then, a photoresist layer is coated on the conductive layer. Then, a portion of the photoresist layer is exposed through a photomask. Afterwards, a patterned photoresist layer is formed by using a development process. Then, a portion of the conductive layer is protected by the patterned photoresist layer, so as to etch rest of the conductive layer. The remaining conductive layer forms the source 122 and the drain 124. In this embodiment, materials of the source 122 and the drain 124 (i.e. a material of the conductive layer) may include a metal, an alloy thereof, a metal oxide, or a conductive polymer material. For example, the materials of the source 122 and the drain 124 include silver, gold, copper, aluminum, nickel, platinum, molybdenum, indium tin oxide, indium zinc oxide, or a combination thereof. Alternatively, the materials of the source 122 and the drain 124 include polyaniline (PANI), poly(3,4-ethylenedioxythiophene) (PEDOT), or graphene.

Figure 1C:
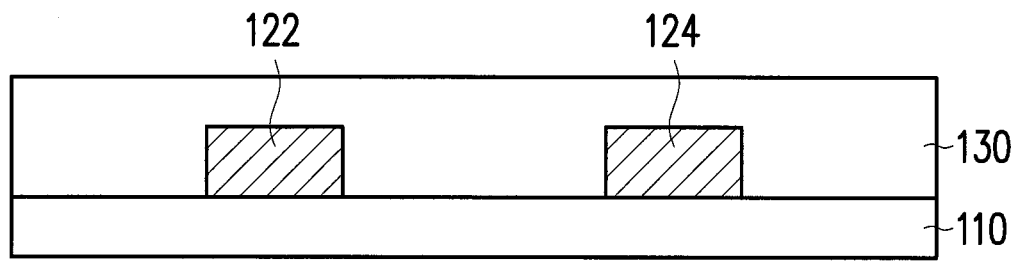

Then, as shown in FIG. 1C, a semiconductor layer 130 is formed on the substrate 110. In addition, the semiconductor layer 130 covers the source 122 and the drain 124. A material of the semiconductor layer 130 may be a small molecule or polymer organic semiconductor material or inorganic semiconductor material. In this embodiment, the material of the semiconductor layer 130 includes pentacene, poly(3-hexylthiophene) (P3HT), poly(3.3′′′-didodecylquarterthiophene) (PQT-12), or indium gallium zinc oxide.

Figure 1D:
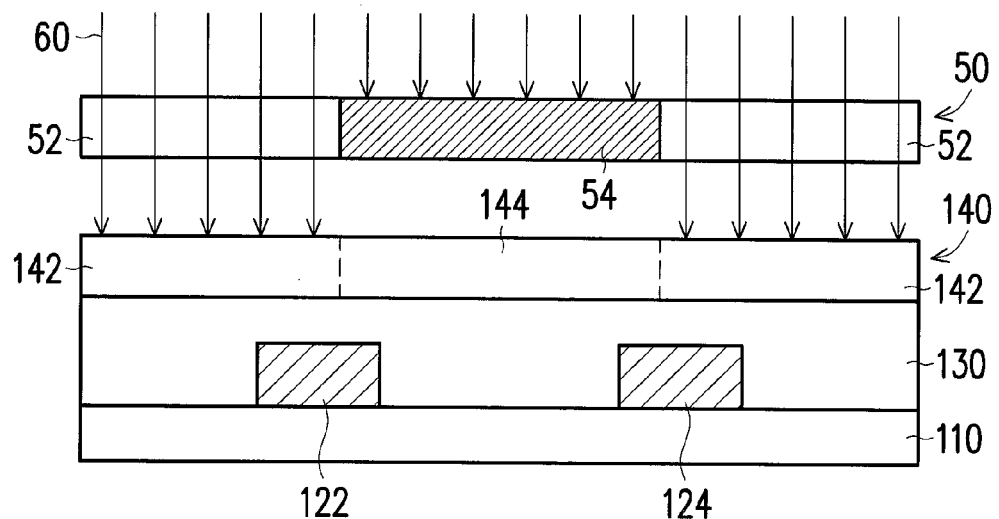

Then, as shown in FIG. 1D, a first light sensitive material layer 140 is formed on the semiconductor layer 130. In this embodiment, a material of the first light sensitive material layer 140 includes polyvinylphenol (PVP), polyvinyl alcohol (PVA), phase transfer photoresist, or negative photoresist. In an embodiment, the phase transfer photoresist is a No. 5214E phase transfer photoresist of AZ Electronic Materials plc, for example, and the negative photoresist is a No. ENPI202 negative photoresist of Everlight Chemical Industrial Corporation, for example. In this embodiment, a thickness of the first light sensitive material layer 140 is 100 nanometers to 1000 nanometers, for example.

Figure 1E:
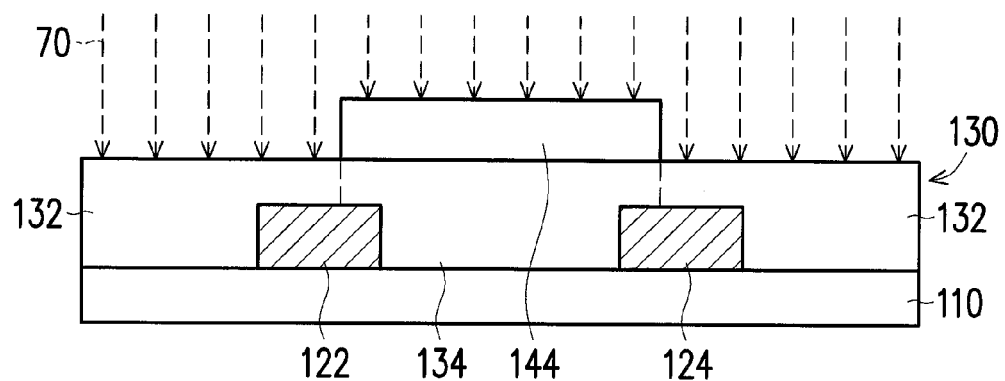

Then, a first portion 142 of the first light sensitive material layer 140 is removed by using a first exposure and development process, and a second portion 144 of the first light sensitive material layer 140 is maintained as a first gate insulation layer. For example, when the first light sensitive material layer 140 is a phase transfer photoresist, the first portion 142 may be exposed through a photomask 50 by using an ultraviolet light 60. The photomask 50 has a light-shielding region 54 and a light transmissive region 52. The ultraviolet light 60 is transmitted to the first portion 142 through the light transmissive region 52, so as to expose the first portion 142. However, since the ultraviolet light 60 may be shielded by the light-shielding region 54 and not be able to be transmitted to the second portion 144, the second portion 144 is not exposed. Then, the first portion 142 is removed by using the development process. The maintained second portion 144 is then exposed through radiation of the ultraviolet light 60 and baked at 120° C. for one to three minutes for phase transfer. However, when the first light sensitive material layer 140 is a negative photoresist, the light-shielding region 54 and the light transmissive region 52 of the photomask 50 are interchanged, such that the second portion 144 is exposed, while the first portion 142 is not exposed. However, after the development process, it is still the second portion 144 that is maintained, while the first portion 142 is removed. In this embodiment, as shown in FIG. 1E, the remaining second portion 144 forms a first gate insulation layer without being removed by a photoresist-removing process.

Figure 1F:
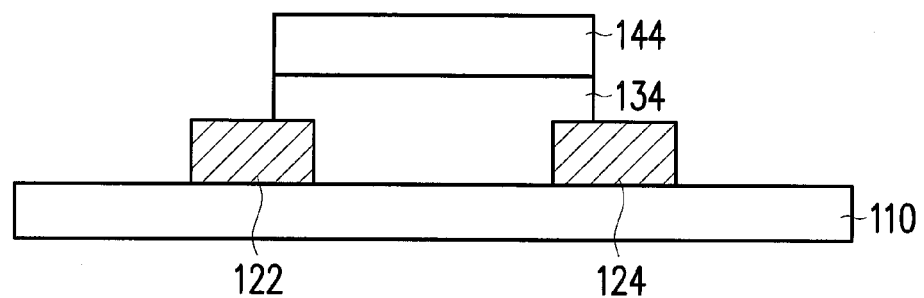

Then, the semiconductor layer 130 is patterned to form a channel layer (i.e. a portion 134 of the semiconductor layer 130) located below the first gate insulation layer (i.e. the second portion 144). For example, a portion 132 of the semiconductor layer 130 may be etched by using dry etching or wet etching, so as to pattern the semiconductor layer 130. In addition, the second portion 144 may serve as an etching stopping layer to prevent the portion 134 of the semiconductor layer 130 below the second portion 144 from being etched. The remaining portion 134 of the semiconductor layer 130 thus forms the channel layer, as shown in FIG. 1F. In addition, the dry etching is to etch the semiconductor layer 130 formed of an organic semiconductor material by using argon plasma or nitrogen plasma, while wet etching is to etch the semiconductor layer 130 formed of indium gallium zinc oxide by using a oxalic acid solution.

Figure 1G:
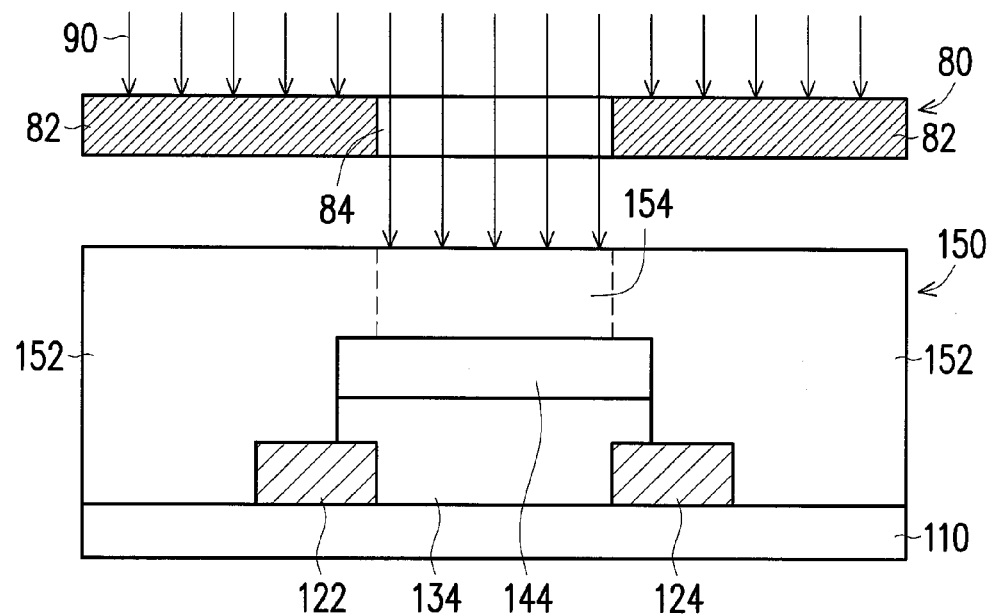

Then, as shown in FIG. 1G, a second light sensitive material layer 150 is formed on the substrate 110. In addition, the second light sensitive material layer 150 covers the source 122, the drain 124, the channel layer (i.e. the portion 134), and the first gate insulation layer (i.e. the second portion 144). In this embodiment, a material of the second light sensitive material layer 150 includes polyvinylphenol (PVP), polyvinyl alcohol (PVA), phase transfer photoresist, or negative photoresist. In an embodiment, the phase transfer photoresist is a No. 5214E phase transfer photoresist of AZ Electronic Materials plc, for example, and the negative photoresist is a No. ENPI202 negative photoresist of Everlight Chemical Industrial Corporation, for example. In this embodiment, a thickness of the second light sensitive material layer 150 is from 100 nanometers to 1000 nanometers, for example. In addition, the materials of the first and second light sensitive material layers 140 and 150 may be the same or different.

Figure 1H:
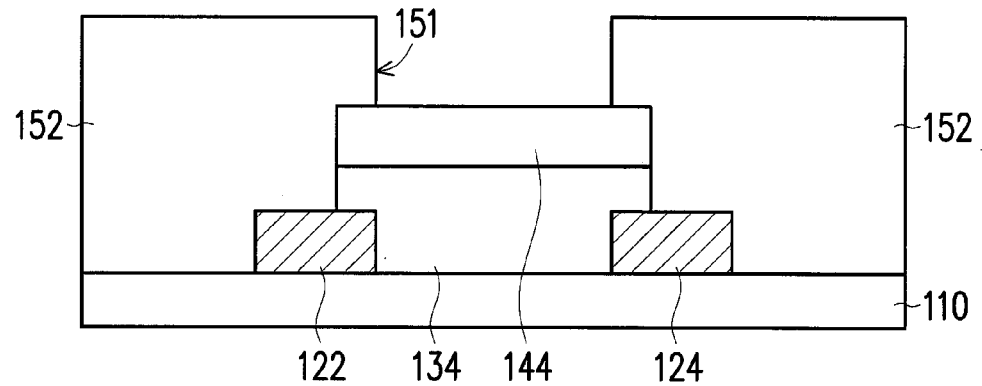

Then, as shown in FIG. 1G, a third portion 154 of the second light sensitive material layer 150 is removed by using a second exposure and development process, so as to expose at least a portion of the first gate insulation layer (i.e. the second portion 144). For example, when the second light sensitive material layer 150 is a phase transfer photoresist, the third portion 154 of the second light sensitive material layer 150 may be exposed through a photomask 80 by using an ultraviolet light 90. Specifically speaking, the ultraviolet light 90 exposes the third portion 154 through a light transmissive region 84 of the photomask 80, and a light-shielding region 82 of the photomask 80 blocks the ultraviolet light 90, such that a fourth portion 152 of the second light sensitive material layer 150 is not exposed. Then, the third portion 154 is removed using the development process, so as to expose an opening 151 of the at least a portion of the first gate insulation layer (i.e. the second portion 144). The remaining second portion 144 is then exposed through radiation of the ultraviolet light 90 and baked at 120° C. for one to three minutes for phase transfer, as shown in FIG. 1H. Besides, when the second light sensitive material layer 150 is a negative photoresist, the light transmissive region 84 and the light-shielding region 82 of the photomask 80 may be interchanged, such that the fourth portion 152, but not the third portion 154, is exposed to the ultraviolet light 90.

Figure 1I:
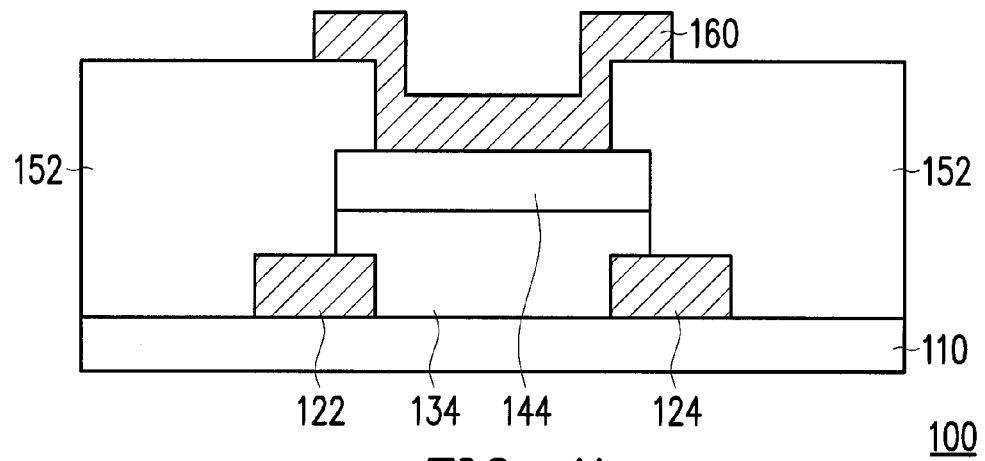

Afterwards, as shown in FIG. 1I, a first gate 160 is formed on the first gate insulation layer (i.e. the second portion 144). In addition, a material of the gate 160 may include a metal, an alloy thereof, a metal oxide, or a conductive polymer material. For example, the material of the first gate 160 includes silver, gold, copper, aluminum, nickel, platinum, molybdenum, indium tin oxide, indium zinc oxide, or a combination thereof. Alternatively, the material of the first gate 160 includes polyaniline (PANT), poly(3,4-ethylenedioxythiophene) (PEDOT), or graphene. The material of the first gate 160 may be the same as or different from the materials of the source 122 and the gate 124. Accordingly, manufacture of the electronic device 100 is completed. In addition, the electronic device 100 is a transistor, such as a thin film transistor. In this embodiment, the first gate 160 may be formed by forming a conductive layer on the first gate insulation layer (i.e. the second portion 144) and the fourth portion 152, and then patterning the conductive layer by using the conventional photolithographic etching process to form the first gate 160.

The electronic device 100 of this embodiment thus includes the substrate 110, the source 122, the drain 124, the channel layer (i.e. the portion 134), the first gate insulation layer (i.e. the second portion 144), the dielectric layer (i.e. the fourth portion 152), and the first gate 160. In addition, the source 122 is disposed on the substrate 110, the drain 124 is disposed on the substrate 110, and the channel layer (i.e. the portion 134) connects the source 122 and the drain 124. The first gate insulation layer (i.e. the second portion 144) is disposed on the channel layer (i.e. the portion 134), the dielectric layer (i.e. the fourth portion 152) covers a portion of the substrate 110 and exposes the at least a portion of the first gate insulation layer (i.e. the second portion 144) (in FIG. 1I, a portion of the first gate insulation layer is exposed as an example), and the first gate 160 is disposed on the first gate insulation layer (i.e. the second portion 144). In this embodiment, the first gate insulation layer (i.e. the second portion 144) and the dielectric layer (i.e. the fourth portion 152) are individually formed. Namely, the two layers are formed in manufacturing processes of different light sensitive material layers.

In the electronic device 100 and the manufacturing method thereof of this embodiment, since the first gate insulation layer (i.e. the second portion 144) and the dielectric layer (i.e. the fourth portion 152) are manufactured by using the light sensitive material, the two layers may be completed by using the exposure and development process without using the etching and photoresist-removing processes. In addition, the layers are kept in the electronic device 100 without being removed after the manufacturing process. In this way, the steps of manufacturing the electronic device may be reduced, so as to reduce the time and cost of manufacture.

Figure 2:
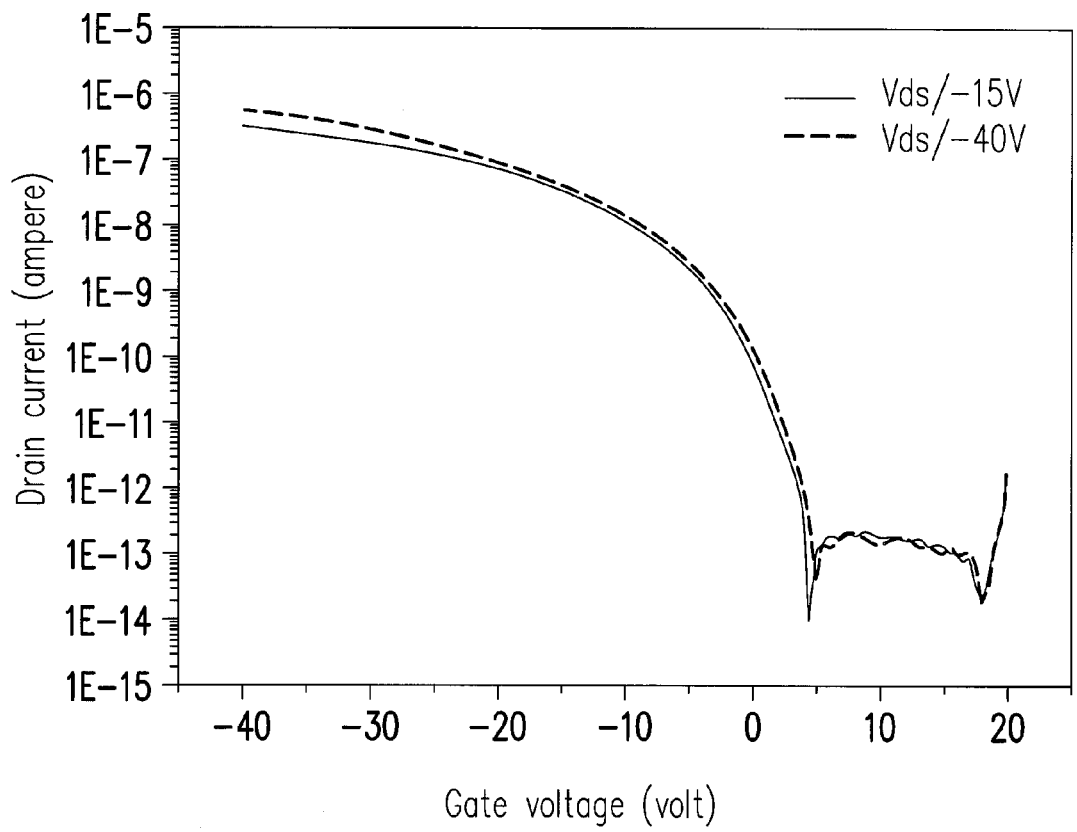
FIG. 2 is a diagram illustrating a characteristic curve of a drain current with respect to a gate voltage of the electronic device shown in FIG. 1I.

FIG. 2 is a diagram illustrating a characteristic curve of a drain current with respect to a gate voltage of the electronic device shown in FIG. 1I. Referring to FIG. 1I and FIG. 2, the dotted curve line in FIG. 2 represents a characteristic curve measured when a voltage difference (i.e. Vds in the figure) between the drain 124 and the source 122 is −15V, and the solid curve line is a characteristic curve measured when the voltage difference (i.e. Vds in the figure) between the drain 124 and the source 122 is −40V. As shown in FIG. 2, when the electronic device 100 serves as a switch, a difference between an on-state current (e.g. the drain current corresponding to the gate voltage at about −40V) and an off-state current (e.g. the drain current corresponding to the gate voltage at about 10V) is about six to seven orders. Therefore, it is shown that the electronic device 100 manufactured according to the manufacturing process shown in FIGS. 1A to 1I has a good electrical performance. In addition, as shown in FIG. 2, an initial voltage when the electronic device 100 is turned on is about 5V.

Figure 3:
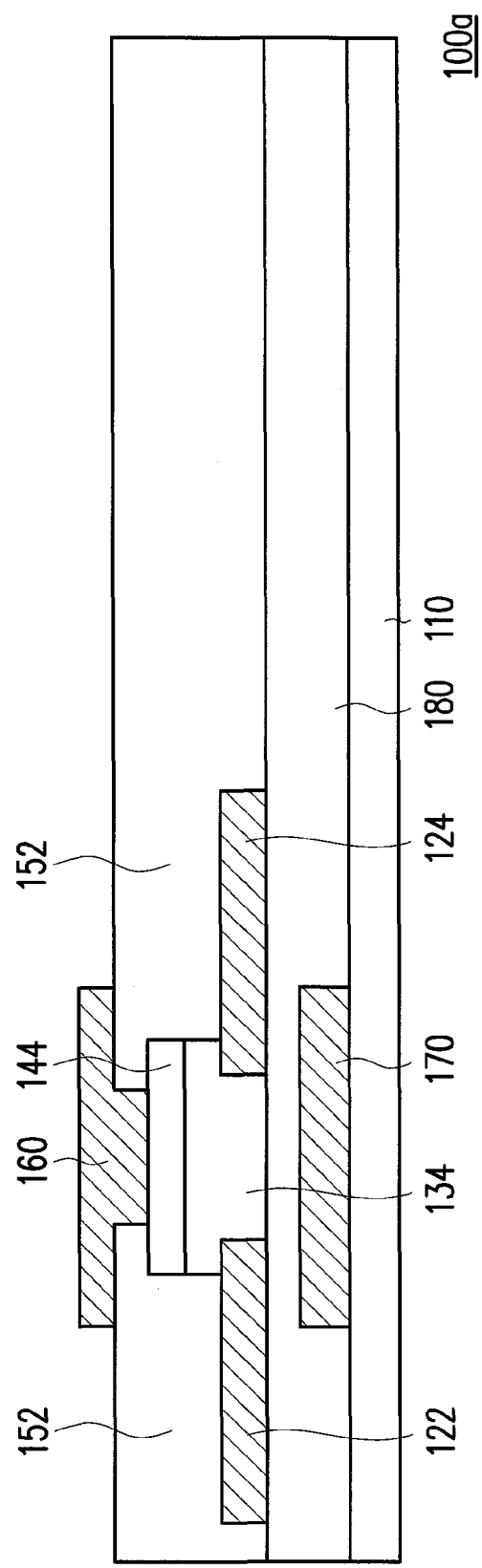
FIG. 3 is a cross-sectional schematic view illustrating a step of a manufacturing method of an electronic device according to the second embodiment of the disclosure and a structure of the electronic device.

FIG. 3 is a cross-sectional schematic view illustrating a step of a manufacturing method of an electronic device according to the second embodiment of the disclosure and a structure of the electronic device. Referring to FIG. 3, a manufacturing method of an electronic device 100a of this embodiment is similar to the manufacturing method of the electronic device 100 shown in FIGS. 1A to 1I. A difference therebetween is described in the following. The manufacturing method of the electronic device 100a of this embodiment further includes sequentially forming a second gate 170 and a second gate insulation layer 180 on the substrate 110 before forming the source 122 and the drain 124 on the substrate 110. In addition, the second insulation layer 180 covers the second gate 170, and the source 122 and the drain 124 are formed on the second gate insulation layer 180. The second gate 170 may be formed by forming a conductive layer on the substrate 110 and forming the second gate 170 by using the conventional photolithographic etching process. A material of the second gate 170 may include a metal, an alloy thereof, a metal oxide, or a conductive polymer material. For example, the material of the second gate 170 includes silver, gold, copper, aluminum, nickel, platinum, molybdenum, indium tin oxide, indium zinc oxide, or a combination thereof. Alternatively, the material of the second gate 170 includes polyaniline (PANI), poly(3,4-ethylenedioxythiophene) (PEDOT), or graphene. The material of the second gate 170 may be the same as or different from the material of first gate 160. In addition, the completed second gate insulation layer 180 covers the second gate 170 and is located between the second gate 170 and the channel layer (i.e. the portion 134). In this way, the electronic device 100a is formed into a dual gate transistor.

FIGS. 4A and 4B are cross-sectional schematic views illustrating two steps of a manufacturing method of an electronic device according to the third embodiment of the disclosure. Referring to FIGS. 4A and 4B, a manufacturing method of an electronic device 100b of this embodiment is similar to the manufacturing method of the electronic device shown in FIGS. 1A to 1I. A difference therebetween is described in the following.

In this embodiment, the manufacturing method of the electronic device 100b further includes forming a patterned inter-layer intermediate layer 190 on the fourth portion 152 of the second light sensitive material layer 150. In addition, the patterned inter-layer intermediate layer 190 covers the first gate 160 and exposes the drain 124. Moreover, the patterned inter-layer intermediate layer 190 is patterned by using the conventional photolithographic etching process. Also, the materials of the first and second light sensitive material layers 140 and 150 may be chosen as a material of the patterned inter-layer intermediate layer 190, and an exposure and development process (without etching and photomask-removing) is used to pattern the dielectric layer formed on a complete surface into the patterned inter-layer intermediate layer 190. Then, a pixel electrode 210 is formed on the substrate. The pixel electrode 210 is formed on the patterned inter-layer intermediate layer 190 and connected with the drain 124.

In this embodiment, the fourth portion 152 covers a portion of the drain 124. In addition, at the same time when the gate 160 is formed on the first gate insulation layer 144 (i.e. the second portion 144), a capacitor 160b is formed on a portion 152b of the fourth portion 152 in an electrode layer manufacturing process the same as that of the first gate 160. In other words, the first gate 160 and the capacitor electrode 160b are formed by patterning (e.g. etching) the same conductive layer. In addition, the capacitor electrode 160b, the portion 152b of the fourth portion 152, and the drain 124 form a capacitor. In this embodiment, the electronic device 100b may serve as a pixel structure of a display panel, and the capacitor may, for example, form a storage capacitor in the pixel structure. Naturally, the plurality of pixel structures 100b arranged in an array may be formed at the same time on the substrate 110 by following the manufacturing steps above, thereby forming the display panel. Although only one of the pixel structure 100b is shown in FIGS. 4A and 4B, the disclosure is not limited thereto.

In the pixel structure 100b of this embodiment, the patterned inter-layer intermediate layer 190 is disposed on the dielectric layer (i.e. the fourth portion 152), covers the first gate 160, and exposes the drain 124. In addition, the pixel electrode 210 is disposed on the patterned inter-layer intermediate layer 190 and electrically connected with the drain 124 by being connected with the drain 124. In addition, a capacitor insulation layer (i.e. the portion 152b) covers a portion of the drain 124, and the capacitor electrode 160b is disposed on the capacitor insulation layer (i.e. the portion 152b). Moreover, the patterned inter-layer intermediate layer 190 may cover at least a portion of the capacitor electrode 160b and separate the capacitor electrode 160b and the pixel electrode 210.

FIGS. 5A and 5B respectively illustrate a minimally extended range and a maximally extended range of the first gate insulation layer in the step shown in FIG. 1F. Referring to FIGS. 1F, 5A, and 5B, in the step shown in FIG. 1F, an extended range of the first gate insulation layer (i.e. the second portion 144) in a direction parallel to an arrangement of the source 122 and the drain 124 is from a first expended range to a second expended range. The first extended range extends from a position aligned with the side of the source 122 toward the drain 124 to a position aligned with the side of the drain 124 toward the source 122 (the first extended range is an extended range of a second portion 144c of FIG. 5A), and the second extended range extends from a position aligned with the side of the source 122 away from the drain 124 to a position aligned with the side of the drain 124 away from the source 122 (the second extended range is an extended range of a second portion 144d of FIG. 5B). An extended range of the second portion 144 of FIG. 1F is between the first extended range of FIG. 5A and the second extended range of FIG. 5B. In addition, the second portions 144c and 144d serving as etching stopping layers have different extended ranges. Therefore, ranges of distribution of the channel layers (i.e. portions 134c and 134d) below the second portions 144c and 144d differ accordingly.

Figure 6:
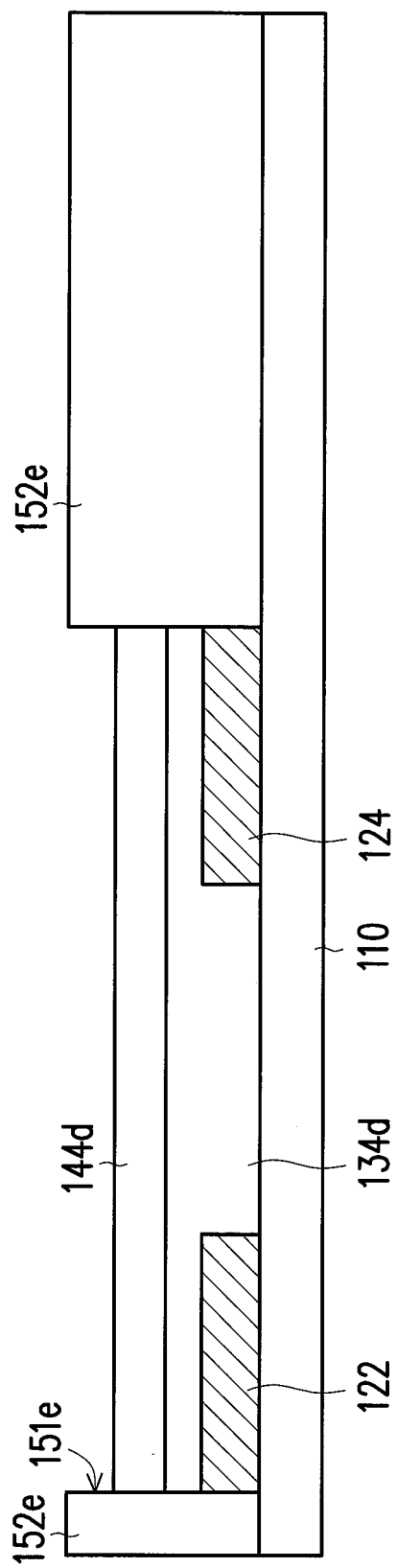
FIG. 6 illustrates a maximal range of distribution of an opening of a dielectric layer in the step shown in FIG. 1H.

FIG. 6 illustrates a maximal range of distribution of the opening of the dielectric layer in the step shown in FIG. 1H. Referring to FIGS. 1H and 6, a range of distribution of the opening 151 of the dielectric layer (i.e. the fourth portion 152) in the direction parallel to the arrangement of the source 122 and the drain 124 is from a first range of distribution to a second range of distribution. The first range of distribution is from the position aligned with the side of the source 122 toward the drain 124 to the position aligned with the side of the drain 124 toward the source 122 (the first range of distribution is the range of distribution of the opening 151 in FIG. 1H), and the second range of distribution is from the position aligned with the side of the source 122 away from the drain 124 to the position aligned with the side of the drain 124 away from the source 122 (the second range of distribution is a range of distribution of an opening 151e of a fourth portion 152e of FIG. 6).

FIGS. 7A and 7B respectively illustrate a minimally extended range and a maximally extended range of the first gate in the step shown in FIG. 1I. Referring to FIGS. 1I, 7A, and 7B, in the step of FIG. 1I, an extended range of the first gate 160 in the direction parallel to the arrangement of the source 122 and the drain 124 is from a third extended range to a fourth extended range. The third extended range extends from the position aligned with the side of the source 122 toward the drain 124 to the position aligned with the side of the drain 124 toward the source 122 (the third extended range is an extended range of a first gate 160f in FIG. 7A), and the fourth extended range extends from a position aligned with the side of the source 122 away from the drain 124 to the position aligned with the side of the drain 124 away from the source 122 (the fourth extended range is an extended range of a first gate 160g in FIG. 7B). An extended range of the first gate 160 in FIG. 1I is between the third extended range of FIG. 7A and the fourth extended range of FIG. 7B.

In view of the foregoing, in the electronic device and the manufacturing method thereof according to the embodiment of the disclosure, since the light sensitive material is used to manufacture the gate insulation layer and another layer (i.e. the dielectric layer) on the first gate insulation layer, the two layers may be completed by using the exposure and development process without using the etching and photoresist-removing process. In addition, the layers are kept in the electronic device without being removed after the manufacturing process. In this way, the steps of manufacturing the electronic device may be reduced, so as to reduce the time and cost of manufacture.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:
1. An electronic device, comprising:
a substrate;
a source, disposed on the substrate;
a drain, disposed on the substrate;
a channel layer, connecting the source and the drain;
a first gate insulation layer, disposed on the channel layer;

a dielectric layer, covering a portion of the substrate and exposing at least a portion of the first gate insulation layer; and a first gate, disposed on the first gate insulation layer, wherein the first gate insulation layer has a first end and a second end opposite to each other, and the first end and the second end are respectively perpendicular to a surface of the substrate, an orthogonal projection of the first end onto the substrate is on an orthogonal projection of the source onto the substrate, and an orthogonal projection of the second end onto the substrate is on an orthogonal projection of the drain onto the substrate, the source and the drain respectively have a side perpendicular to the surface of the substrate, and the first end and the second end are respectively aligned with the side of the source and the side of the drain, wherein one of two opposite ends of the channel layer is aligned to the first end of the first gate insulation layer, and the other one of the two opposite ends of the channel layer is aligned to the second end of the first gate insulation layer.

2. The electronic device as claimed in claim 1, wherein the first gate insulation layer and the dielectric layer are formed of a material originating from a light sensitive material capable of being removed in an exposure and development process, and the light sensitive material comprises polyvinylphenol (PVP), polyvinyl alcohol (PVA), phase transfer photoresist, or negative photoresist.

3. The electronic device as claimed in claim 1, wherein a material of the channel layer is an organic semiconductor or a metal oxide semiconductor.

4. The electronic device as claimed in claim 1, wherein a material of the channel layer comprises pentacene, poly(3-hexylthiophene) (P3HT), poly(3.3'''-didodecylquarterthiophene) (PQT-12), or indium gallium zinc oxide.

5. The electronic device as claimed in claim 1, further comprising:
   a second gate, disposed between the channel layer and the substrate; and
   a second gate insulation layer, disposed on the substrate, covering the second gate, and located between the second gate and the channel layer.

6. The electronic device as claimed in claim 1, further comprising:
   a patterned inter-layer intermediate layer, disposed on the dielectric layer, covering the first gate, and exposing the drain; and
   a pixel electrode, disposed on the patterned inter-layer intermediate layer and being connected with the drain.

7. The electronic device as claimed in claim 1, further comprising:
   a capacitor insulation layer, covering a portion of the drain; and
   a capacitor electrode, disposed on the capacitor insulation layer, wherein the capacitor electrode, the capacitor insulation layer, and the drain form a capacitor.

8. The electronic device as claimed in claim 7, wherein an orthogonal projection of the capacitor electrode onto the substrate is on an orthogonal projection of the drain onto the substrate.

9. The electronic device as claimed in claim 1, wherein the dielectric layer has an opening exposing at least a portion of the first gate insulation layer, and a range of distribution of the opening in a direction parallel to an arrangement of the source and the drain is from a first range of distribution to a second range of distribution, wherein the first range of distribution is from a position aligned with the side of the source toward the drain to a position aligned with the side of the drain toward the source, and the second range of distribution is from a position aligned with another side of the source away from the drain to a position aligned with another side of the drain away from the source.

10. The electronic device as claimed in claim 1, wherein materials of the source, the drain, and the first gate are a metal, an alloy thereof, a metal oxide, or an organic conductive material.

11. The electronic device as claimed in claim 1, wherein materials of the source, the drain, and the first gate comprise silver, gold, copper, aluminum, nickel, platinum, molybdenum, indium tin oxide, indium zinc oxide, or a combination thereof, or the materials of the source, the drain, and the first gate comprise polyaniline (PANI), poly(3,4-ethylenedioxythiophene) (PEDOT), or graphene.

* * * * *